US012574025B2

(12) United States Patent
Xie et al.

(10) Patent No.: US 12,574,025 B2
(45) Date of Patent: Mar. 10, 2026

(54) TRANSISTOR ASSEMBLIES WITH GATE CURRENT SHUNTING CAPABILITY, AND ASSOCIATED METHODS

(71) Applicant: Analog Devices, Inc., Wilmington, MA (US)

(72) Inventors: Shuo Xie, Tempe, AZ (US); Hio Leong Chao, Tempe, AZ (US); Ling Su, Chandler, AZ (US); Xu Wang, Phoenix, AZ (US)

(73) Assignee: Analog Devices, Inc., Wilmington, MA (US)

( * ) Notice: Subject to any disclaimer, the term of this patent is extended or adjusted under 35 U.S.C. 154(b) by 102 days.

(21) Appl. No.: 18/408,871

(22) Filed: Jan. 10, 2024

(65) Prior Publication Data

US 2024/0243741 A1      Jul. 18, 2024

Related U.S. Application Data

(60) Provisional application No. 63/480,278, filed on Jan. 17, 2023.

(51) Int. Cl.
| | |
|---|---|
| *H03K 17/00* | (2006.01) |
| *H03K 17/0812* | (2006.01) |
| *H04N 25/709* | (2023.01) |
| *H10D 84/00* | (2025.01) |

(52) U.S. Cl.
CPC ..... *H03K 17/08122* (2013.01); *H04N 25/709* (2023.01); *H10D 84/154* (2025.01)

(58) Field of Classification Search
CPC ...... H03K 17/08; H03K 17/081; H03K 17/10; H03K 17/102; H03K 17/12; H03K 17/122; H03K 17/13; H03K 17/133; H03K 17/16; H03K 17/161; H03K 17/162; H03K 17/687; H03K 17/6871; H03K 17/6872; H03K 17/6873
See application file for complete search history.

(56) References Cited

U.S. PATENT DOCUMENTS

| | | | | |
|---|---|---|---|---|
| 5,612,582 A * | 3/1997 | Shichi | .............. | H03K 17/04206 307/130 |
| 5,818,281 A * | 10/1998 | Ohura | ................ | H03K 17/0828 327/198 |
| 7,660,094 B2 * | 2/2010 | Urakabe | ............ | H03K 17/6871 361/111 |

(Continued)

*Primary Examiner* — Tuan T Lam
(74) *Attorney, Agent, or Firm* — ArentFox Schiff LLP

(57) ABSTRACT

A transistor assembly with gate current shunting capability includes first field effect transistor (FET), a first pull-up current source, a first pull-down current source, a first switching device, a control circuit, a capacitor, and a second FET. The first FET is an N-channel FET including a first gate, a first drain, and a first source. The first drain is electrically coupled to a first power supply. Each of the pull-up current source and the pull-down current source is electrically coupled to the first gate. The first switching device is electrically coupled in series with the first pull-down current source and is controlled by a first control signal. The control circuit is at least partially powered by a second power supply and generates the first control signal. The capacitor and the second FET collectively shunt current away from the first gate during a pre-power operating state of the transistor assembly.

20 Claims, 13 Drawing Sheets

(56)        References Cited

U.S. PATENT DOCUMENTS

| | | | |
|---|---|---|---|
| 9,590,609 B1 * | 3/2017 | Musa | H03K 17/08122 |
| 11,936,383 B2 * | 3/2024 | Shah | H03K 17/162 |
| 2011/0148376 A1 * | 6/2011 | Xu | H03K 17/165 |
| | | | 327/434 |
| 2022/0107909 A1 * | 4/2022 | Banerjee | G06F 13/4086 |
| 2024/0364332 A1 * | 10/2024 | Lai | H03K 5/01 |
| 2025/0015798 A1 * | 1/2025 | Sugie | H02P 27/00 |

* cited by examiner

600

TRANSISTOR ASSEMBLIES WITH GATE CURRENT SHUNTING CAPABILITY, AND ASSOCIATED METHODS

RELATED APPLICATIONS

This application claims benefit of U.S. Provisional Patent Application Ser. No. 63/480,278, filed on Jan. 17, 2023, which is incorporated herein by reference.

BACKGROUND

Transistors are extensively used in electrical circuits, such as for switching or for amplification. Examples of transistors include, but are not limited to, field effect transistors (FETs), bipolar junction transistors (BJTs), and insulated gate bipolar junction transistors (IGBTs). FETs are extensively used in modern integrated circuits, and a given integrated circuit may include many FETs. FETs have a high gate impedance, and FETs may therefore be considered voltage controlled devices.

DETAILED DESCRIPTION OF THE EMBODIMENTS

Figures 1, 2:
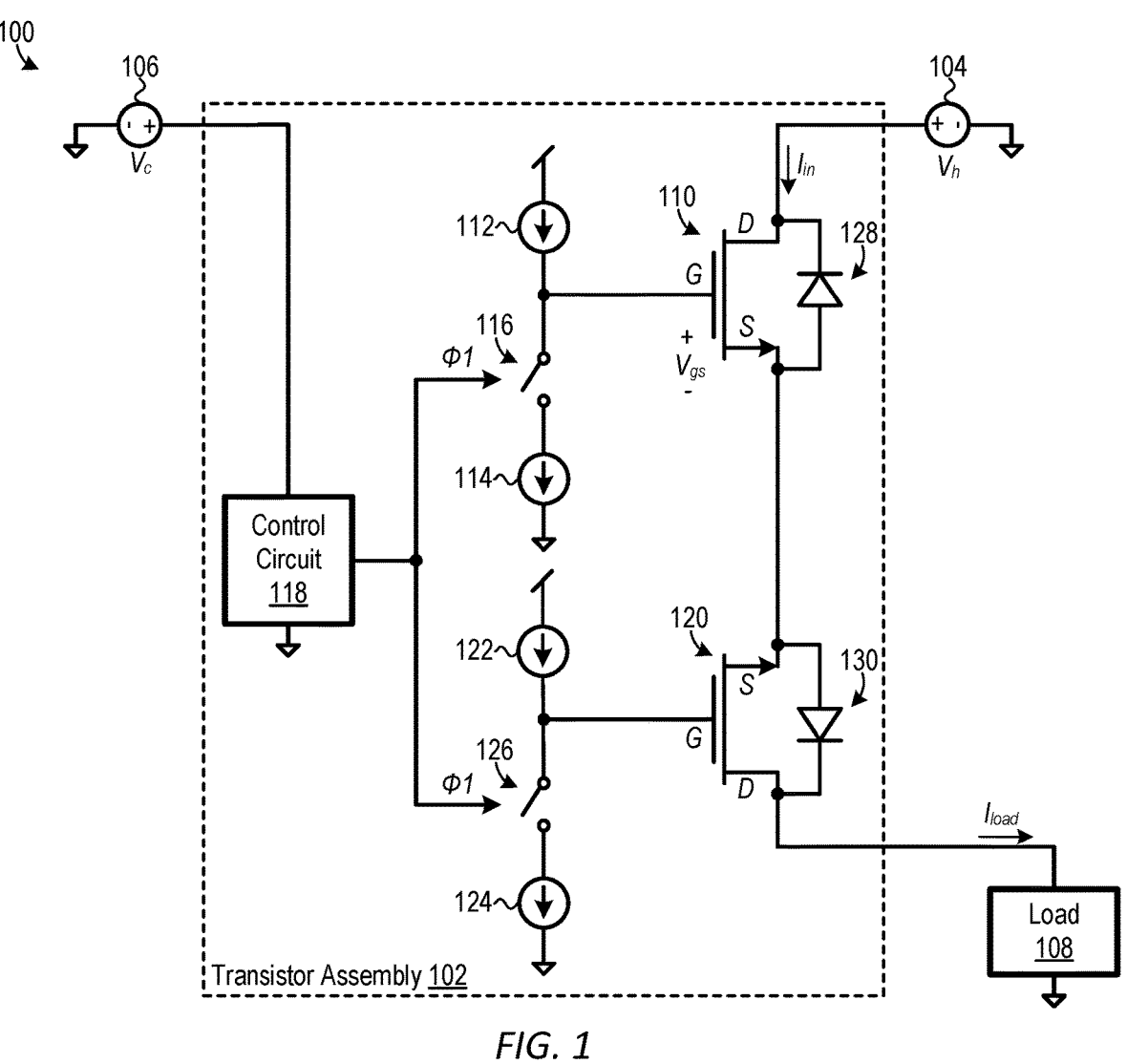
FIG. 1 is a schematic diagram of an electrical circuit including a transistor assembly and two power supplies.
FIG. 2 is a graph illustrating one example of power supply sequencing during start-up of the FIG. 1 electrical circuit.

Many electrical circuits operate with two or more power supplies. For example, FIG. 1 is a schematic diagram of an electrical circuit 100 including a transistor assembly 102, a first power supply 104, a second power supply 106, and a load 108. First power supply 104 has a voltage $V_h$, and second power supply 106 has a voltage $V_c$. Transistor assembly 102 includes a field effect transistor (FET) 110, a pull-up current source 112, a pull-down current source 114, a switching device 116, a control circuit 118, a FET 120, a pull-up current source 122, a pull-down current source 124, and a switching device 126. Each of FET 110 and FET 120 is an N-channel FET including a respective gate (G), a respective drain (D), and a respective source (S). The drain of FET 110 is electrically coupled to first power supply 104, and the source of FET 110 is electrically coupled to the source of FET 120. The drain of FET 120 is electrically coupled to load 108.

The gate of FET 110 is electrically coupled to each of pull-up current source 112 and switching device 116, and switching device 116 is electrically coupled between the gate of FET 110 and pull-down current source 114. Switching device 116 is controlled by a control signal Φ1 generated by control circuit 118. Similarly, the gate of FET 120 is electrically coupled to each of pull-up current source 122 and switching device 126, and switching device 126 is electrically coupled between the gate of FET 120 and pull-down current source 124. Switching device 126 is also controlled by a control signal Φ1 generated by control circuit 118. In this document, a "pull-up current source" is a current source configured to charge capacitance of a gate of a FET, such a gate-to-source capacitance and/or a gate-to-drain capacitance. A "pull-down current source," in contrast, is a current source configured to discharge capacitance of a gate of a FET, such a gate-to-source capacitance and/or a gate-to-drain capacitance.

Control circuit 118 is powered by second power supply 106. Accordingly, control circuit 118 is not capable of operation unless second power supply 106 is active. Pull-up current source 112, pull-down current source 114, pull-up current source 122, and pull-down current source 124 are directly or indirectly powered by first power supply 104 and/or second power supply 106. In this document, the term "ground," which is designated in the figures by a downward pointing triangular arrow, may be any reference node, including an earth ground, a chassis ground, or a reference node that is at a different electrical potential than an earth ground or a chassis ground.

Transistor assembly 102 is configured as a switching assembly where transistor assembly 102 controls flow of current $I_{load}$ to load 108 in response to control signal Φ1 generated by control circuit 118. Specifically, when control signal Φ1 is de-asserted, switching device 116 is in its off-state, and pull-up current source 112 accordingly charges a gate-to-source capacitance (not shown in FIG. 1) of FET 110, thereby causing a voltage $V_{gs}$ between the gate and source of FET 110 to be greater than a threshold gate-to-source voltage of FET 110. Consequently, FET 110 is in its on-state. Similarly, when control signal Φ1 is de-asserted, switching device 126 is in its off-state, and pull-up current source 122 accordingly charges a gate-to-source capacitance (not shown in FIG. 1) of FET 120, thereby causing a voltage $V_{gs}$ between the gate and source of FET 120 to be greater than a threshold gate-to-source voltage of FET 120. Consequently, FET 120 is also in its on-state. Thus, both of FETs 110 and 120 are in their respective on-states when control signal $\Phi 1$ is de-asserted, which allows current $I_{load}$ to flow from first power supply 104 to load 108. In this document, a switching device (e.g., a transistor) is in its "off-state" when it is in its non-conductive state (neglecting possible parasitic current paths, such as through a body diode of a FET), while a switching device (e.g., a transistor) is in its "on-state" when it is in its conductive state.

When control signal $\Phi 1$ is asserted, switching device 116 is in its on-state, and pull-down current source 114, which has a larger current magnitude than pull-up current source 112, prevents pull-up current source 112 from charging the gate-to-source capacitance of FET 110. Consequently, voltage $V_{gs}$ of FET 110 is below the threshold gate-to-source voltage of FET 110, and FET 110 is therefore in its off-state. Similarly, when control signal $\Phi 1$ is asserted, switching device 126 is in its on-state, and pull-down current source 124, which has a larger current magnitude than pull-up current source 122, prevents pull-up current source 122 from charging the gate-to-source capacitance of FET 120. Consequently, voltage $V_{gs}$ of FET 120 is below the threshold gate-to-source voltage of FET 120, and FET 120 is therefore in its off-state. As such, both of FETs 110 and 120 are in their respective off-states when control signal $\Phi 1$ is asserted, and the two FETs collectively block flow of current $I_{load}$ to load 108. It should be noted that respective body diodes 128 and 130 of FETs 110 and 120 have opposing orientations with respect to current $I_{load}$, which prevents current $I_{load}$ from flowing through body diodes 128 and 130 when FETs 110 and 120 are in their respective off-states.

First power supply 104 and second power supply 106 may become active at different times during start-up of electrical circuit 100, such as if second power supply 106 is generated from a voltage regulator powered from first power supply 104. In this document, a power supply is "active" if its voltage is at a non-zero steady state value, e.g., the voltage is at a predetermined specified value within specified tolerance range. For example, a power supply specified to provide a voltage of 5 volts within a tolerance value of +/−10% is active if its voltage is within a range of 4.5 volts to 5.5 volts. Conversely, in this document, a power supply is "inactive" if its voltage is zero or is not at a steady state value. For example, a power supply specified to provide a voltage of 5 volts within a tolerance value of +/−10% is inactive if its voltage is outside of a range of 4.5 volts to 5.5 volts FIG. 2 is a graph 200 of voltage versus time illustrating one example of power supply sequencing during start-up of electrical circuit 100. Graph 200 includes curves representing each of voltage $V_h$ of first power supply 104 and voltage $V_c$ of second power supply 106. Electrical circuit 100 starts up at a time $t_0$, and first power supply 104 reaches its steady state voltage $V_{h\_s}$ at a time $t_1$. Second power supply 106, however, does not reach its steady state value $V_{c\_s}$ until significantly later at a time $t_2$. For example, second power supply 106 may be generated by a linear regulator or by a switching power converter powered from first power supply 104, and this linear regulator or switching power converter may be unable to start-up until first power supply 104 is active. Accordingly, during a pre-power state of transistor assembly 102 between times $t_0$ and $t_2$, first power supply 104 is active, i.e., its voltage $V_h$ is at its steady state value $V_{h\_s}$, while second power supply 106 is inactive, i.e., its voltage $V_c$ is not at its steady state value $V_{c\_s}$. Both first power supply 104 and second power supply 106 are active in a power-on state of transistor assembly 102 which begins at the conclusion of the pre-power state at time $t_2$. The disparity of power supply operating states during the pre-power state, i.e., that first power supply 104 is active while second power supply 106 is inactive, may be problematic.

Figures 3, 4:
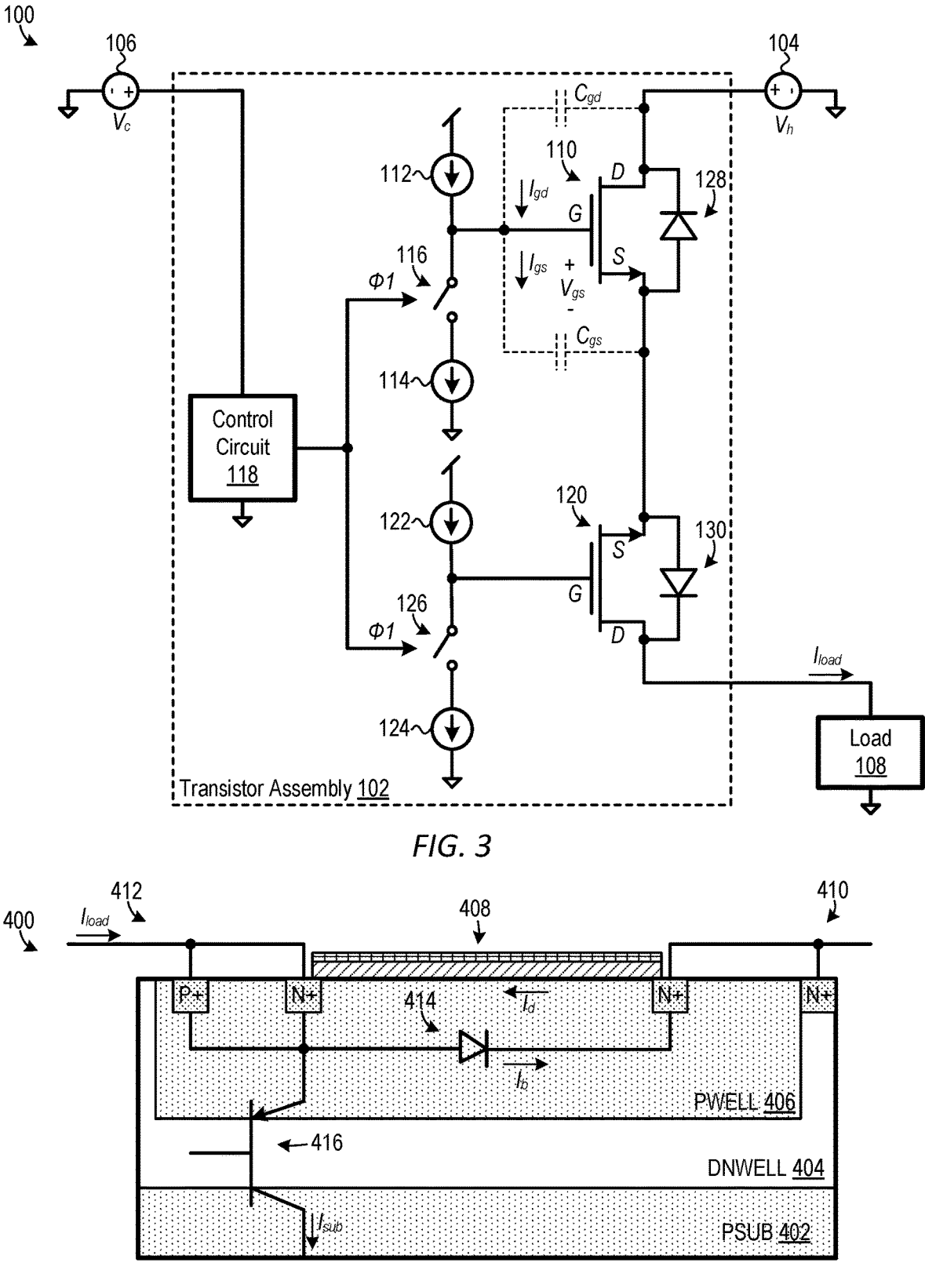
FIG. 3 is a schematic diagram of the FIG. 1 electrical circuit illustrating one example of operation of the electrical circuit during a pre-power state.
FIG. 4 is a cross-sectional view of an embodiment of a field effect transistor (FET) of the FIG. 1 transistor assembly.

For example, FIG. 3 is a schematic diagram of electrical circuit 100 illustrating one example of operation of electrical circuit 100 during the pre-power state of transistor assembly 102. FIG. 3 symbolically shows gate-to-source capacitance $C_{gs}$ and gate-to-drain capacitance $C_{gd}$ of FET 110. Assume that transistor assembly 102 is operating its pre-power state in the example of FIG. 3 where first power supply 104 is active but second power supply 106 is inactive. Control circuit 118 is non-operational because second power supply 106 is inactive. Consequently, control circuit 118 is not capable of controlling operating state of FET 110 or FET 120 during the pre-power state. Additionally, pull-up current source 112, pull-down current source 114, pull-up current source 122, and pull-down current source 124 are also typically non-operational during the pre-power state.

However, current $I_{gd}$ flows through gate-to-drain capacitance $C_{gd}$, and current $I_{gs}$ flows through gate-to-source capacitance $C_{gs}$, during the pre-power state due to rise of voltage $V_h$ of first power supply 104. Current flowing through a capacitor is proportional to change in voltage across the capacitor over time, and magnitude of each of current $I_{gd}$ and current $I_{gs}$ will therefore increase with increasing slope dv/dt of first power supply voltage $V_h$ (see FIG. 2). Current $I_{gs}$ will charge gate-to-source capacitance $C_{gs}$ and may cause voltage $V_{gs}$ to rise above the threshold gate-to-source voltage of FET 110, thereby causing FET 110 to operate in its on-state and not block flow of current $I_{load}$.

Additionally, FET 120 will provide a path for current $I_{load}$ once FET 110 begins to operate in its on-state. For example, FIG. 4 is a cross-sectional view of a FET 400, which is one possible embodiment of FET 120. FET 400 includes a p-type substrate (PSUB) 402, a deep n-type well (DNWELL) 404, a p-type well (PWELL) 406, and a gate 408. FET 400 additionally forms a drain 410, a source 412, a body diode 414, and a parasitic PNP bipolar junction transistor (BJT) 416. Once FET 110 begins to operate in its on-state during the pre-power state of transistor assembly 102, a portion of current $I_{load}$ referred to as a current $I_b$ will flow through body diode 414, even though FET 120 is in its off-state and current $I_d$ is therefore zero. Furthermore, BJT 416 may operate in its on-state resulting in a portion of current $I_{load}$ referred to as a substrate current $I_{sub}$ flowing through BJT 416. Magnitude of current $I_{sub}$ may be large due to current gain, referred to as Beta ($\beta$), of BJT 416, potentially causing latch up and permanent damage to FET 400. Accordingly, FET 120 may provide a path for a large magnitude of current $I_{load}$ if FET 110 operates in its on-state during the pre-power state of transistor assembly 102, even though FET 120 is in its off-state.

Consequently, magnitude of current $I_{load}$ may be uncontrolled during the pre-power state of transistor assembly 102, particularly when slope dv/dt of first power supply voltage $V_h$ is high. Such uncontrolled magnitude of current $I_{load}$ may cause improper operation of electrical circuit 100, damage one or more elements of electrical circuit 100 as well as circuitry connected to electrical circuit 100, and/or present a safety concern. Such problems may be particularly acute when using modern FET fabrication processes where gate-to-source threshold voltage is relatively low, e.g., approximately 0.8 volts, such that FET 110 may have a high likelihood of turning on during a pre-power state. As such, potential uncontrolled operation of FET 110 in its on-state during the pre-power state of transistor assembly 102 may cause significant problems.

Disclosed herein are new transistor assemblies with gate current shunting capability and associated methods which at least partially solve the aforementioned problems. Certain embodiments of the new transistor assemblies include a transistor (or other switching device) which shunts current away from a gate of a FET during a pre-power state, thereby minimizing, or even eliminating, possibility of uncontrolled operation of the FET in its on-state during a pre-power state. Additionally, some embodiments are capable of operating over a wide range of power supply voltage slope during start-up, and certain embodiments do not affect transistor assembly operation during a power-on state.

Figure 5:
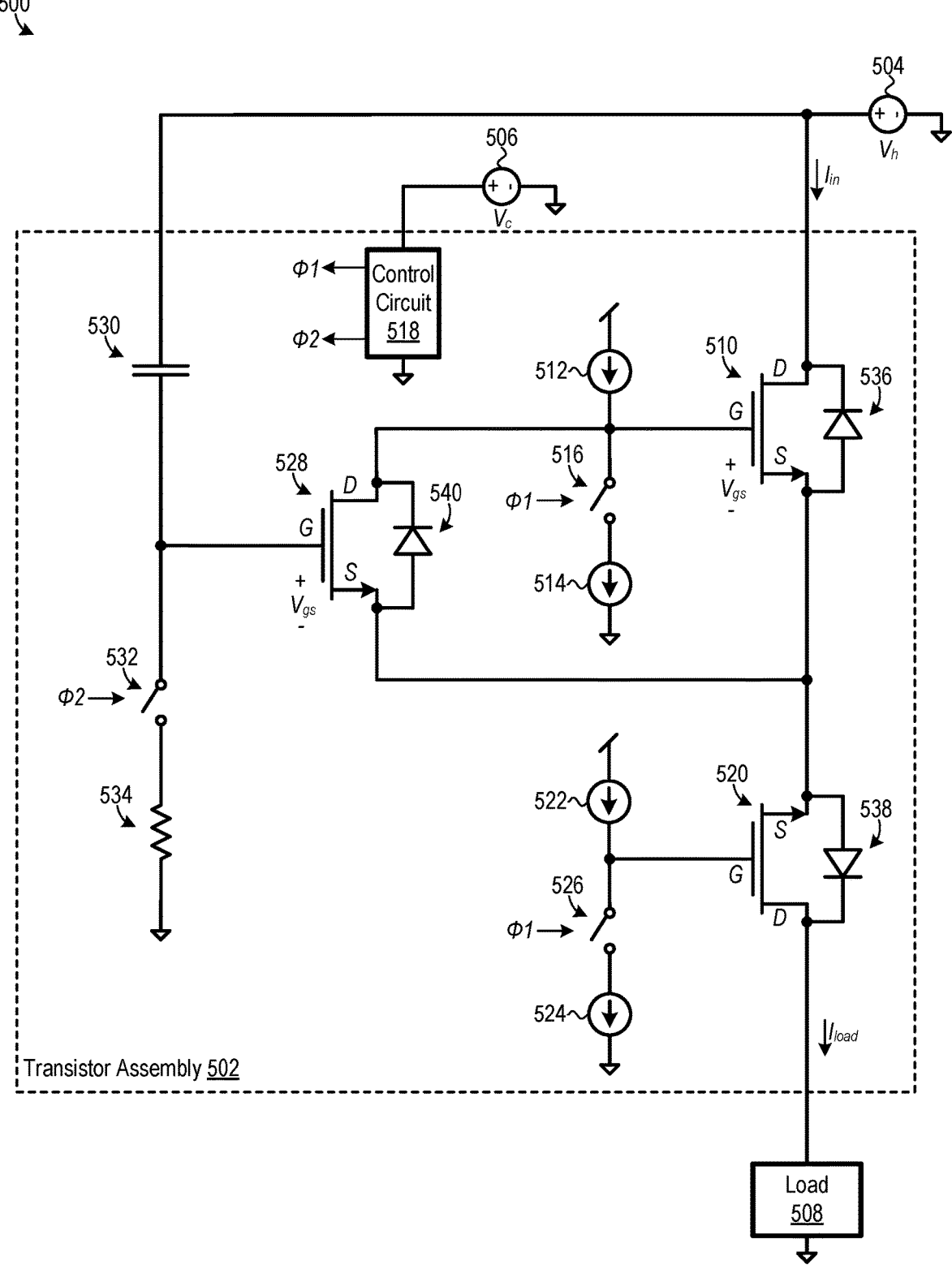
FIG. 5 is a schematic diagram of an electrical circuit including a transistor assembly with gate current shunting capability, according to an embodiment.

FIG. 5 is a schematic diagram of an electrical circuit 500 including a transistor assembly 502, a first power supply 504, and second power supply 506, and a load 508, where transistor assembly 502 is one embodiment of the new transistor assemblies with gate current shunting capability. First power supply 504 has a voltage $V_h$, and second power supply 506 has a voltage $V_c$. Transistor assembly 502 includes a FET 510, a pull-up current source 512, a pull-down current source 514, a switching device 516, a control circuit 518, a FET 520, a pull-up current source 522, a pull-down current source 524, a switching device 526, a FET 528, a capacitor 530, a switching device 532, and a resistor 534.

Each of FET 510 and FET 520 is an N-channel FET including a respective gate (G), a respective drain (D), and a respective source (S). Additionally, FETs 510 and 520 include respective body diodes 536 and 538. The drain of FET 510 is electrically coupled to first power supply 504, and the source of FET 510 is electrically coupled to the source of FET 520. The drain of FET 520 is electrically coupled to load 508. Load 508 is electrically coupled between the drain of FET 520 and ground. As such, FETs 510 and 520 are electrically coupled in series between first power supply 504 and load 508.

The gate of FET 510 is electrically coupled to each of pull-up current source 512 and switching device 516, and switching device 516 is electrically coupled between the gate of FET 510 and pull-down current source 514. In some embodiments, switching device 516 is a transistor, such as an N-channel FET, a P-channel FET, or a BJT. Switching device 516 is controlled by a control signal $\Phi 1$ generated by control circuit 518. In some alternate embodiments, topological positions of pull-down current source 514 and switching device 516 are swapped in transistor assembly 502. The gate of FET 520 is electrically coupled to each of pull-up current source 522 and switching device 526, and switching device 526 is electrically coupled between the gate of FET 520 and pull-down current source 524. In some embodiments, switching device 526 is a transistor, such as an N-channel FET, a P-channel FET, or a BJT. In some alternate embodiments, topological positions of pull-down current source 524 and switching device 526 are swapped in transistor assembly 502. Switching device 526 is also controlled by a control signal $\Phi 1$ generated by control circuit 518. In some alternate embodiments, however, switching device 516 and switching device 526 are controlled by different respective control signals, instead of by a common control signal $\Phi 1$. In some embodiments, control signal $\Phi 1$ is asserted when in a logic high state, while in some other embodiments, control signal $\Phi 1$ is asserted when in a logic low state.

Control circuit 518 is at least partially powered by second power supply 506, and pull-up current source 512, pull-down current source 514, pull-up current source 522, and pull-down current source 524 are optionally directly or indirectly powered by first power supply 504 and/or second power supply 506. Control circuit 518 is embodied, for example, by analog electronics and/or by digital electronics. Although control circuit 518 is depicted as being incorporated within transistor assembly 502, control circuit 518 could alternately be partially or completely external to transistor assembly 502 without departing from the scope hereof. Furthermore, while control circuit 518 is illustrated as being a single element, control circuit 518 could include multiple elements that need not be collocated. Moreover, although control circuit 518 is shown as being a discrete element, control circuit 518 could be partially or completely combined with one or more other elements.

FET 528 is an N-channel FET including a gate (G), a drain (D), a source (S), and a body diode 540. The drain of FET 528 is electrically coupled to the gate of FET 510, and the source of FET 528 is electrically coupled to the source of FET 510. Capacitor 530 is electrically coupled between first power supply 504 and the gate of FET 528. Switching device 532 and resistor 534 are electrically coupled in series between the gate of FET 528 and ground, such that switching device 532 is electrically coupled between the gate of FET 528 and ground via resistor 534. In some alternate embodiments, the topological positions of switching device 532 and resistor 534 are swapped in transistor assembly 502. Furthermore, in some other embodiments, resistor 534 is omitted, such that switching device 532 is directly electrically coupled between the gate of FET 528 and ground. Switching device 532 is controlled by a control signal $\Phi 2$ generated by control circuit 518. In some embodiments, switching device 532 is a transistor, such as an N-channel FET, a P-channel FET, or a BJT. In certain embodiments, control signal $\Phi 2$ is asserted when in a logic high state, while in some other embodiments, control signal $\Phi 2$ is asserted when in a logic low state.

Transistor assembly 502 is configured as a switching assembly where transistor assembly 502 controls flow of current $I_{load}$ to load 508 in response to control signal $\Phi 1$ generated by control circuit 518. Specifically, when control signal $\Phi 1$ is de-asserted, switching device 516 is in its off-state, and pull-up current source 512 accordingly charges a gate-to-source capacitance (not shown in FIG. 5) of FET 510, thereby causing a voltage $V_{gs}$ between the gate and source of FET 510 to be greater than a threshold gate-to-source voltage of FET 510. Consequently, FET 510 is in its on-state. Similarly, when control signal $\Phi 1$ is de-asserted, switching device 526 is in its off-state, and pull-up current source 522 accordingly charges a gate-to-source capacitance (not shown in FIG. 5) of FET 520, thereby causing a voltage $V_{gs}$ between the gate and source of FET 520 to be greater than a threshold gate-to-source voltage of FET 520. Consequently, FET 520 is also in its on-state. Thus, both of FETs 510 and 520 are in their respective on-states when control signal $\Phi 1$ is de-asserted, which allows current $I_{load}$ to flow from first power supply 504 to load 508 via FETs 510 and 520.

On the other hand, when control signal $\Phi 1$ is asserted, switching device 516 is in its on-state, and pull-down current source 514, which has a larger current magnitude than pull-up current source 512, prevents pull-up current source 512 from charging the gate-to-source capacitance of FET 510. Consequently, voltage $V_{gs}$ is below the threshold gate-to-source voltage of FET 510, and FET 510 is therefore in its off-state. Similarly, when control signal $\Phi 1$ is asserted, switching device 526 is in its on-state, and pull-down current source 524, which has a larger current magnitude than pull-up current source 522, prevents pull-up current source 522 from charging the gate-to-source capacitance of FET 520. Consequently, voltage $V_{gs}$ is below the threshold gate-to-source voltage of FET 520, and FET 520 is therefore in its off-state. As such, both of FETs 510 and 520 are in their respective off-states when control signal $\Phi1$ is asserted, and the two FETs collectively block flow of current $I_{load}$ to load 508. Accordingly, control circuit 518 is configured to control respective operating states of FETs 510 and 520 via generation of control signal $\Phi1$. It should be noted that respective body diodes 536 and 538 of FETs 510 and 520 have opposing orientations with respect to current $I_{load}$, which prevents current $I_{load}$ from flowing through body diodes 536 and 538 when FETs 510 and 520 are in their respective off-states.

In a manner similar to that discussed above with respect to FIGS. 1 and 2, first power supply 504 may become active before second power supply 506. Control circuit 518 is configured to assert control signal $\Phi2$ in response to control circuit 518 being capable of controlling operating state of at least FET 510, such as in response to second power supply 506 being active. For example, control circuit 518 may assert control signal $\Phi2$ in response to voltage $V_c$ of second power supply 506 reaching its steady state value, in response to voltage $V_c$ of second power supply 506 reaching a predetermined minimum threshold value, and/or in response to voltage $V_c$ of second power supply 506 being within a predetermined ranges of values.

Figure 6:
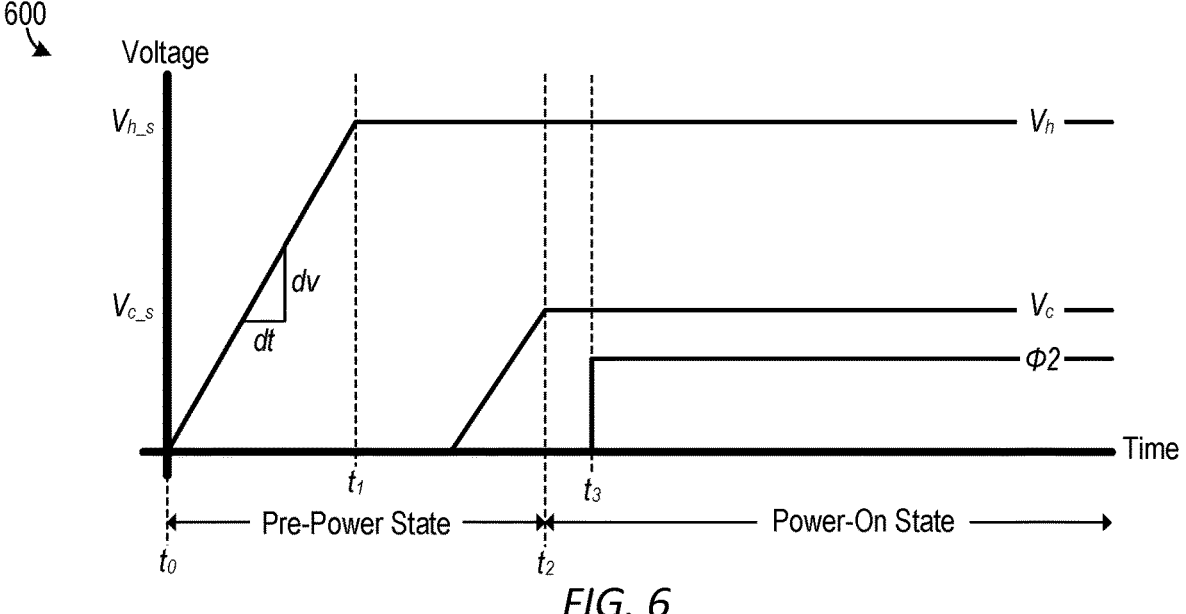
FIG. 6 is a graph illustrating one example of power supply sequencing during start-up of the FIG. 5 electrical circuit.

FIG. 6 is a graph 600 of voltage versus time illustrating one example of power supply sequencing during start-up of electrical circuit 500. Graph 600 includes curves representing each of voltage $V_h$ of first power supply 504, voltage $V_c$ of second power supply 506, and control signal $\Phi2$. Electrical circuit 500 starts up at a time $t_0$, and first power supply 504 reaches its steady state voltage $V_{h\_s}$ at a time $t_1$. Second power supply 506, however, does not reach its steady state value $V_{c\_s}$ until significantly later at a time $t_2$. For example, second power supply 506 may be generated by a linear regulator or by a switching power converter powered from first power supply 504, and this linear regulator or switching power converter may not be able to start-up until first power supply 504 is active. Accordingly, during a pre-power state of transistor assembly 502 between times $t_0$ and $t_2$, first power supply 504 is active, i.e., its voltage $V_h$ is at its steady state value $V_{h\_s}$, while second power supply 506 is inactive, i.e., its voltage $V_c$ is not at its steady state value $V_{c\_s}$. Both first power supply 504 and second power supply 506 are active in a power-on state of transistor assembly 502 which begins at the conclusion of the pre-power state at time $t_2$. Control circuit 518 asserts control signal $\Phi2$ at time $t_3$ when second power supply 506 is active. The time at which control circuit 518 asserts control signal $\Phi2$ may vary as long as second power supply 506 is active when control circuit 518 asserts control signal $\Phi2$, to ensure that control circuit 518 is capable of controlling operating state of at least FET 510 when control signal $\Phi2$ is asserted. For example, in some embodiments, control circuit 518 is configured to immediately assert control signal $\Phi2$ in response to second power supply 506 being active, and in some other embodiments, control circuit 518 is configured to assert control signal $\Phi2$ in response to second power supply 506 being active but after expiration of a delay period. While FIG. 6 depicts control signal $\Phi2$ being in a logic high state when asserted, control signal $\Phi2$ could alternatively have a different polarity, e.g., control signal $\Phi2$ could be in a logic low state when asserted.

Figure 7:
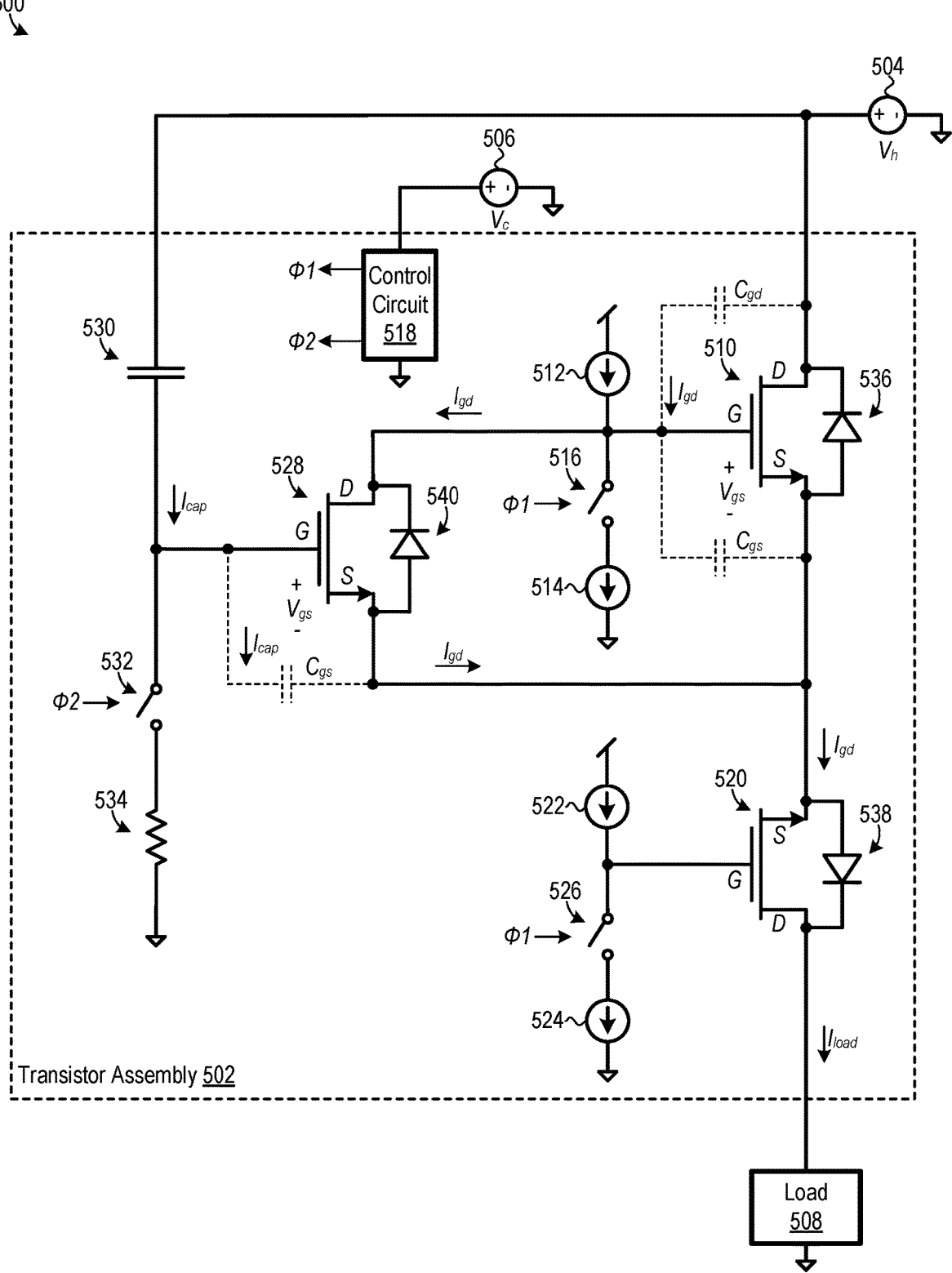
FIG. 7 is a schematic diagram of the FIG. 5 electrical circuit illustrating one example of operation of the electrical circuit during a pre-power state.

FET 528 and capacitor 530 are collectively configured to shunt current away from the gate of FET 510 while transistor assembly 502 is in its pre-power state, thereby reducing or eliminating possibility of FET 510 operating in its on-state while transistor assembly 502 is in its pre-power state. For example, FIG. 7 is a schematic diagram of electrical circuit 500 illustrating one example of operation of electrical circuit 500 during the pre-power state. FIG. 7 symbolically shows gate-to-source capacitance $C_{gs}$ and gate-to-drain capacitance $C_{gd}$ of FET 510, and FIG. 7 also symbolically shows gate-to-source capacitance $C_{gs}$ of FET 528. Assume that transistor assembly 502 is operating in its pre-power state in the example of FIG. 6 where first power supply 504 is active and second power supply 506 is inactive. Control circuit 518 is non-operational because second power supply 506 is inactive. Consequently, control circuit 518 is not capable of controlling the operating state of FET 510 or FET 520 during the pre-power state of transistor assembly 502. Additionally, while not required, pull-up current source 512, pull-down current source 514, pull-up current source 522, and pull-down current source 524 are also typically non-operational during the pre-power state.

However, a current $I_{cap}$ flows from first power supply 504 through capacitor 530 to the gate of FET 528 while transistor assembly 502 is in its pre-power state and magnitude of voltage $V_h$ is changing. Current $I_{cap}$ charges the gate-to-source capacitance of FET 528, thereby causing a voltage $V_{gs}$ between the gate and source of FET 528 to be greater than a threshold gate-to-source voltage of FET 528. Consequently, FET 528 is in its on-state, and FET 528 shunts current $I_{gd}$ flowing through gate-to-drain capacitance $C_{gd}$ of FET 510 away from the gate of FET 510 via the drain of FET 528, such that current $I_{gd}$ flows around gate-to-source capacitance $C_{gs}$ of FET 510 and through body diode 538 of FET 520, as illustrated in FIG. 7. Consequently, gate-to-source capacitance $C_{gs}$ of FET 510 is not charged by current $I_{gd}$, and voltage $V_{gs}$ between the gate and source of FET 510 is therefore less than the threshold gate-to-source voltage of FET 510. Consequently, FET 510 does not turn on while transistor assembly 502 is in its pre-power state, thereby preventing the problems discussed above with respect to electrical circuit 100 where magnitude of current $I_{load}$ may be uncontrolled during the pre-power state.

As discussed above, control circuit 518 asserts control signal $\Phi2$ once second power supply 506 is in its active state, which causes switching device 532 to operate in its on-state and thereby discharge gate-to-source capacitance $C_{gs}$ of FET 528 through resistor 534 to ground, which causes a voltage $V_{gs}$ between the gate and source of FET 528 to fall to less than the threshold gate-to-source voltage of FET 528, resulting in FET 528 transitioning from its on-state to its off-state. Consequently, FET 528 does not affect operation of transistor assembly 502 after control circuit 518 asserts control signal $\Phi2$. Magnitude of current $I_{cap}$ will typically be minimal once transistor assembly 502 is operating in its power-on state, assuming that magnitude of voltage $V_h$ of first power supply 504 is substantially constant. In any event, switching device 532 will shunt any current $I_{cap}$ during the power-on state through resistor 534 to ground, thereby preventing FET 528 from operating in its on-state while transistor assembly 502 is operating in its power-on state.

Figure 8:
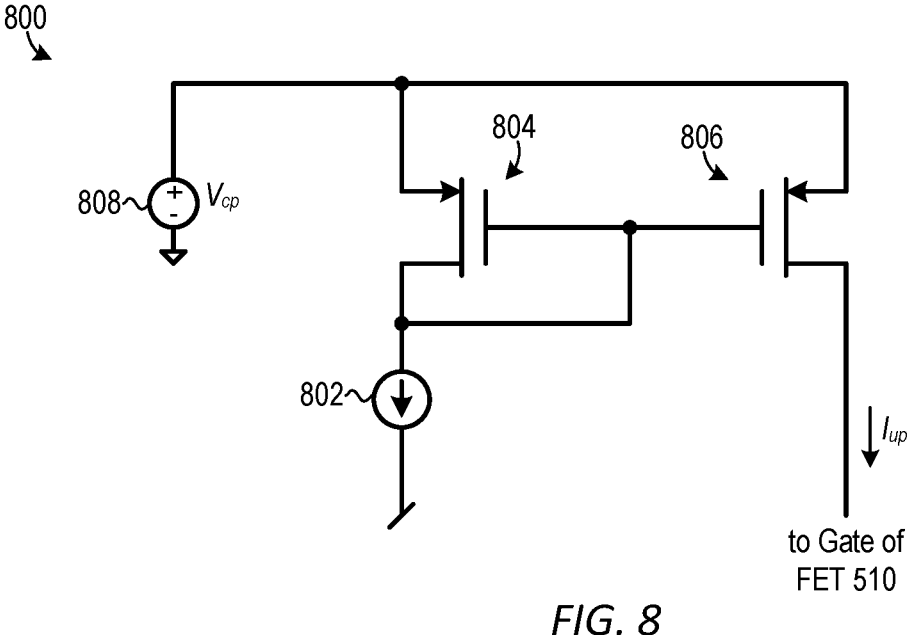
FIG. 8 is a schematic diagram of one embodiment of a pull-up current source of the FIG. 5 transistor assembly.

FIG. 8 is a schematic diagram of a pull-up current source 800, which is one possible embodiment of pull-up current source 512 of transistor assembly 502. Pull-up current source 522 may also be embodied in a manner similar to that illustrated in FIG. 8. However, pull-up current sources 512 and 522 are not limited to being embodied according to FIG. 8.

Pull-up current source 800 includes a current source 802, a first P-channel FET 804, a second P-channel FET 806, and a power supply 808 configured to power pull-up current source 800. Power supply 808 is, for example, a charge pump power supply that is powered from first power supply 504, such that a voltage $V_{cp}$ of power supply 808 has a greater magnitude that voltage $V_h$ of first power supply 504, to ensure that pull-up current source 800 is capable of charging the gate-to-source capacitance of FET 510 to a sufficiently high voltage to enable FET 510 to operate in its on-state. For example, in certain embodiments where FET 510 has a gate-to-source threshold voltage of around 1.8 volts, voltage $V_{cp}$ is at least 1.8 volts greater than voltage $V_h$. First P-channel FET 804 and second P-channel FET 806 are collectively configured to mirror current of current source 802 and thereby generate a pull-up current $I_{up}$, for charging gate-to-source capacitance of FET 510.

Figure 9:
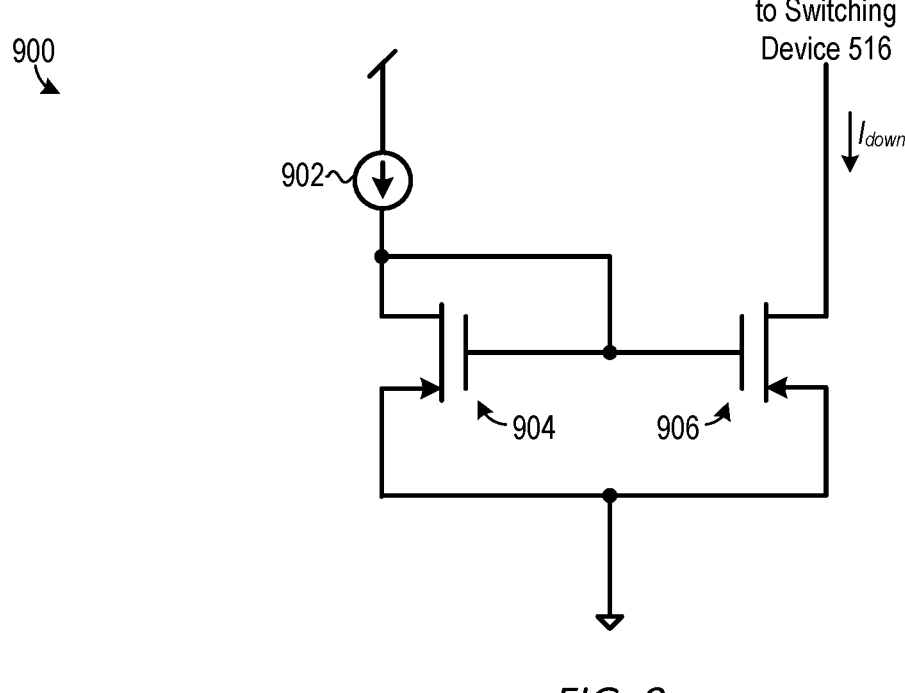
FIG. 9 is a schematic diagram of one embodiment of a pull-down current source of the FIG. 5 transistor assembly.

FIG. 9 is a schematic diagram of a pull-down current source 900, which is one possible embodiment of pull-down current source 514 of transistor assembly 502. Pull-down current source 524 may also be embodied in a manner similar to that illustrated in FIG. 9. However, pull-down current sources 514 and 524 are not limited to being embodied according to FIG. 9.

Pull-down current source 900 includes a current source 902, a first N-channel FET 904, and a second N-channel FET 906. First N-channel FET 904 and second N-channel FET 906 are collectively configured to mirror current of current source 902 and thereby generate a pull-down current $I_{down}$, for discharging gate-to-source capacitance of FET 510.

Figure 10:
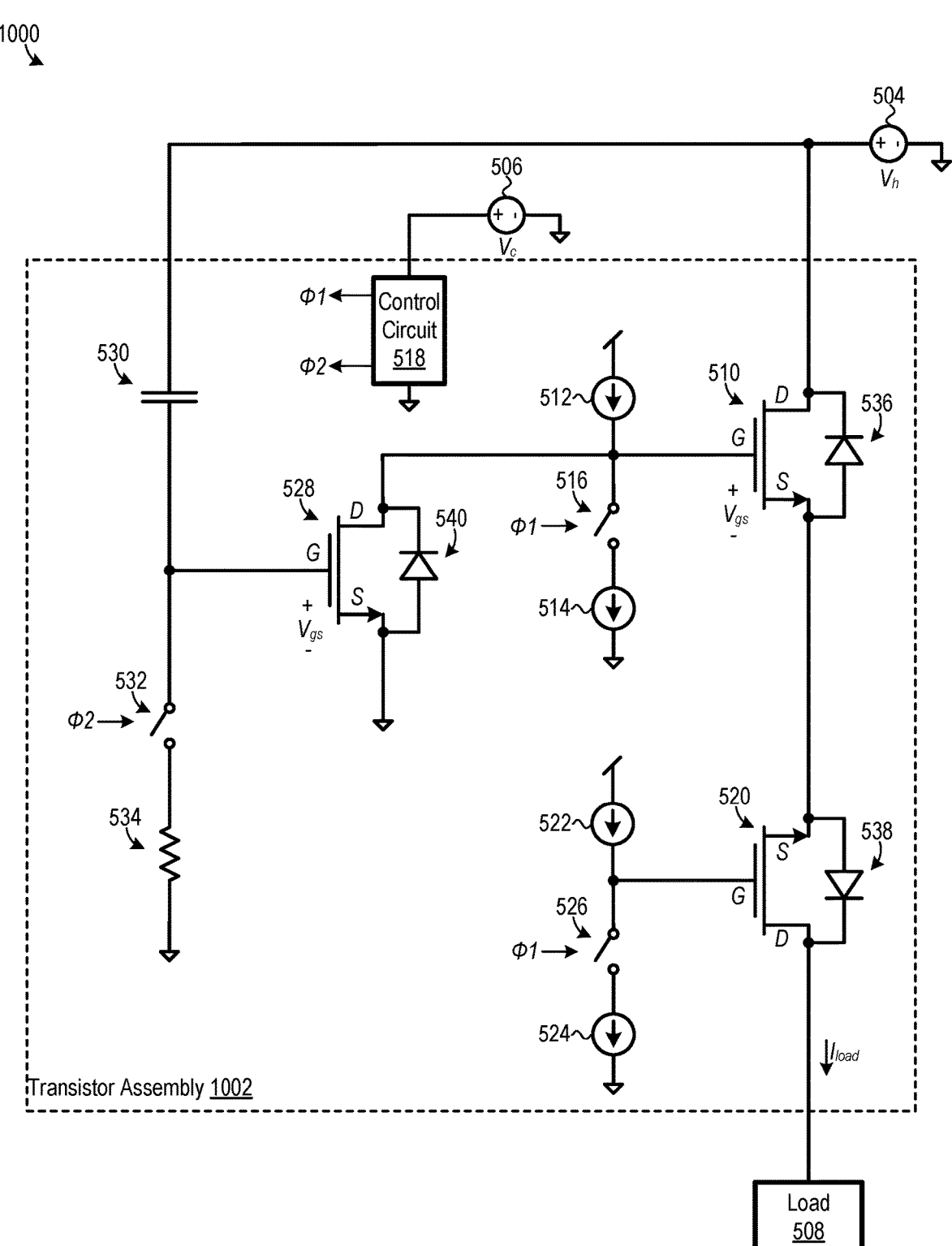
FIG. 10 is schematic diagram of an alternate embodiment of the FIG. 5 electrical circuit where a FET is configured to shunt gate current to ground.

Referring again to FIG. 5, changes may be made to transistor assembly 502 without departing from the scope hereof as long as transistor assembly 502 is capable of shunting current away from the gate of FET 510 during a pre-power state of transistor assembly 502. For example, FIG. 10 is a schematic diagram of an electrical circuit 1000, which is an alternate embodiment of electrical circuit 500 of FIG. 5 where transistor assembly 502 is replaced with a transistor assembly 1002. Transistor assembly 1002 is like transistor assembly 502 except that the source of FET 528 is electrically coupled to ground, instead of to the source of FET 510. Consequently, FET 528 will shunt current away from the gate of FET 510 and to ground, in a pre-power state of transistor assembly 1002.

Figure 11:
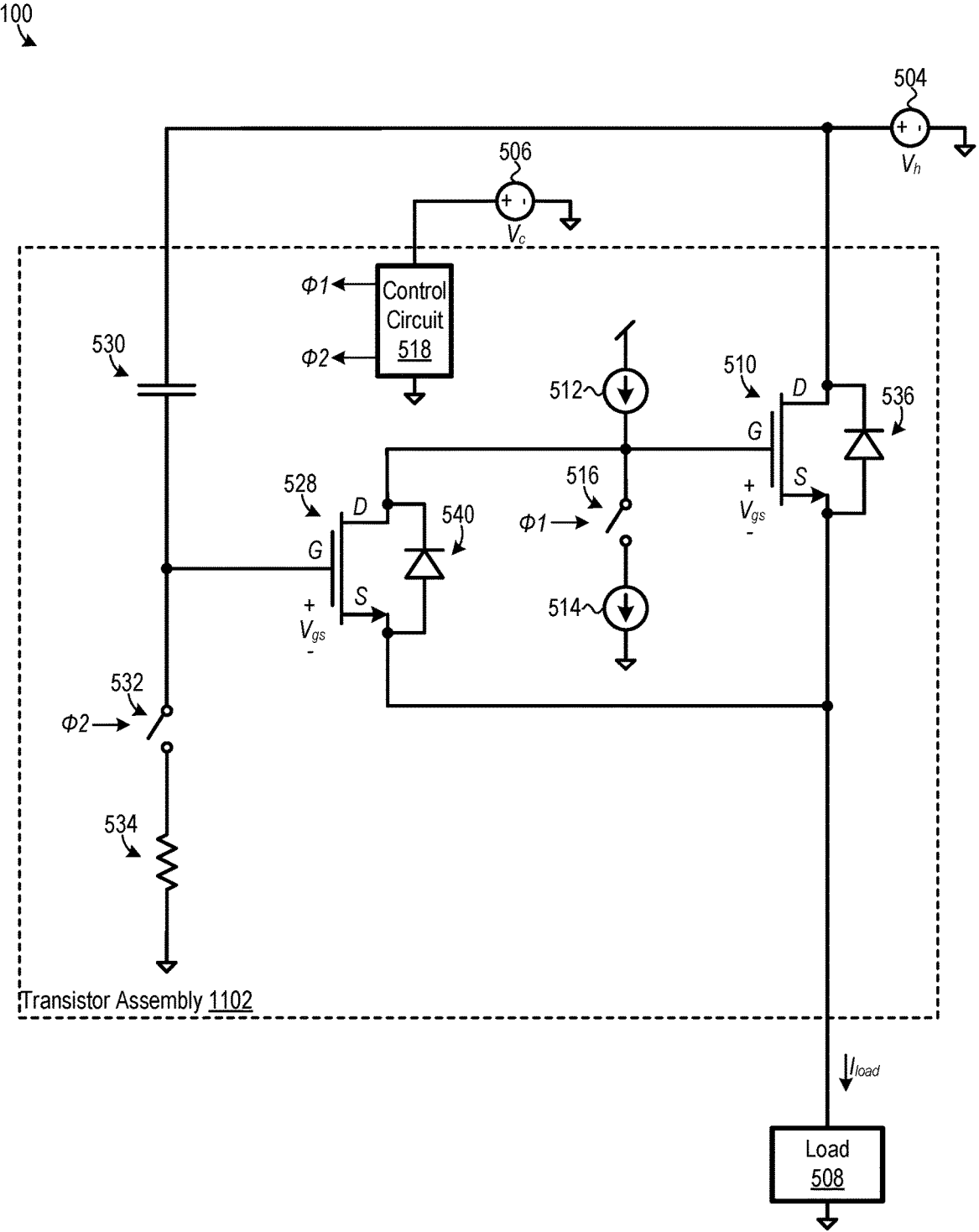
FIG. 11 is a schematic diagram of an alternate embodiment of the FIG. 5 electrical circuit omitting one FET and associated elements.

As another example, FIG. 11 is a schematic diagram of an electrical circuit 1100, which is an alternate embodiment of electrical circuit 500 of FIG. 5 where transistor assembly 502 is replaced with transistor assembly 1102. Transistor assembly 1102 is like transistor assembly 502 except that FET 520, pull-up current source 522, pull-down current source 524, and switching device 526 are omitted. Transistor assembly 1102 may be used, for example, in applications where transistor assembly 1102 need not be capable of blocking flow of current $I_{load}$ having negative polarity, i.e., current flowing from load 508 to first power supply 504.

Figure 12:
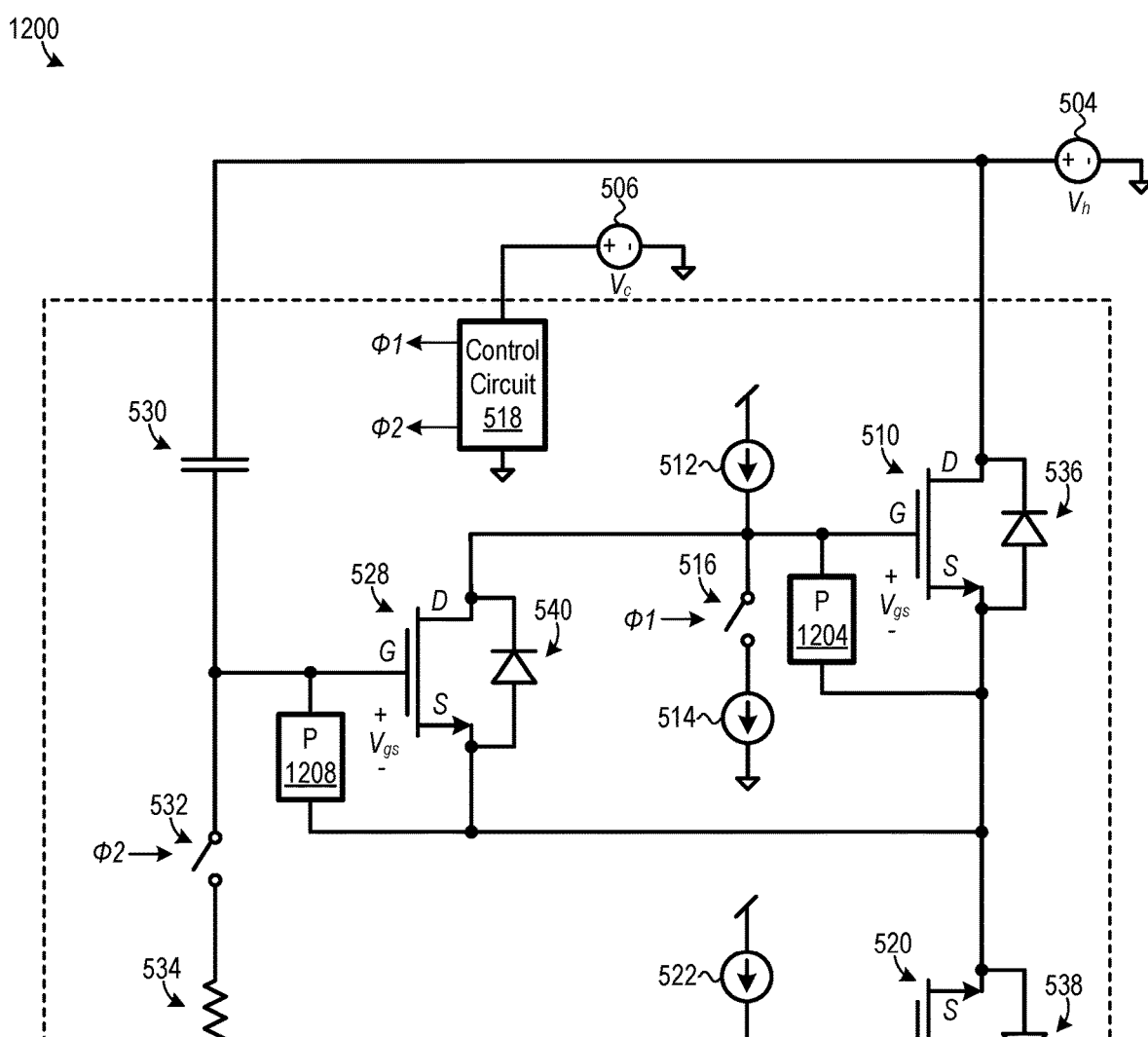
FIG. 12 is a schematic diagram of an alternate embodiment of the FIG. 5 electrical circuit further including protection circuitry.

Referring again to FIG. 5, certain alternate embodiments of transistor assembly 502 further include respective protection circuitry for one or more of FETs 510, 520, and 528, such as to protect the FETs from excessive gate-to-source voltage magnitude and/or to protect the FETs from reverse polarity gate-to-source voltage. For example, FIG. 12 is a schematic diagram of an electrical circuit 1200, which is an alternate embodiment of electrical circuit 500 of FIG. 5 where transistor assembly 502 is replaced with a transistor assembly 1202. Transistor assembly 1202 is like transistor assembly 502 except that transistor assembly 1202 further includes protection circuitry (P) 1204, protection circuitry 1206, and protection circuitry 1208. In some alternate embodiments, though, one or two instances of protection circuitry are omitted from transistor assembly 1202. For example, an alternate embodiment of transistor assembly 1202 includes protection circuitry 1204 and 1206 but omits protection circuitry 1208.

Each of protection circuitry 1204, 1206, and 1208 is configured to protect its respective FET 510, 520, and 528 from excessive gate-to-source voltage $V_{gs}$ magnitude by preventing $V_{gs}$ from exceeding a predetermined maximum value, such as by clamping voltage $V_{gs}$ in response to voltage $V_{gs}$ rising to a threshold value. Additionally, each of protection circuitry 1204, 1206, and 1208 is configured to protect its respective FET 510, 520, and 528 from reverse polarity gate-to-source voltage, i.e., where magnitude of voltage at the source is greater than magnitude of voltage at the gate, by clamping magnitude of reverse polarity gate-to-source voltage $V_{gs}$, such as to a forward conduction voltage of one or more diodes.

Figure 13:
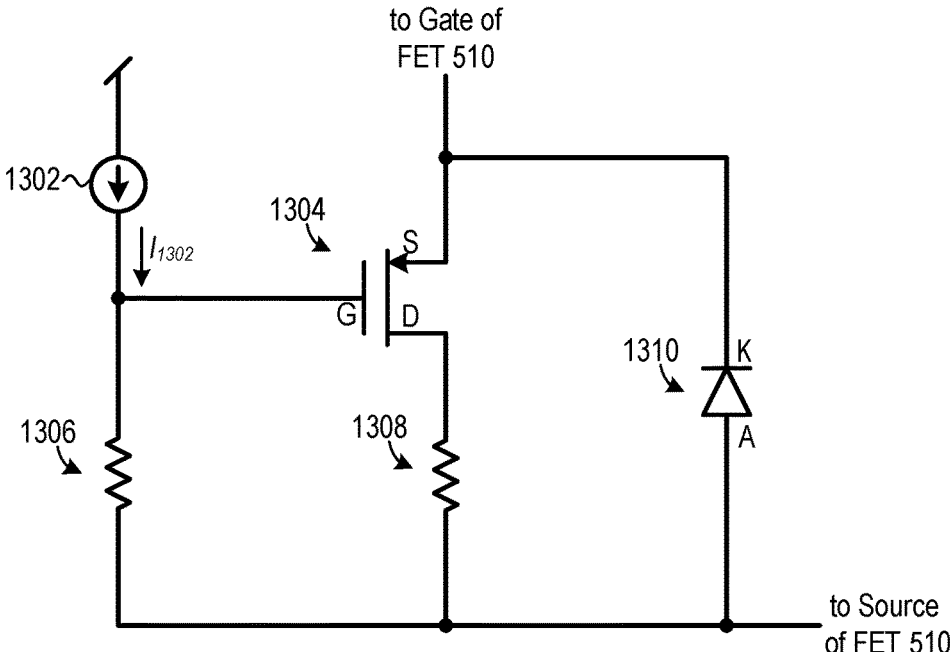
FIG. 13 is a schematic diagram of one embodiment of protection circuitry of the FIG. 12 electrical circuit.

FIG. 13 is a schematic diagram of a protection circuit 1300, which is one possible embodiment of protection circuitry 1204 of FIG. 12. Protection circuitry 1206 may also be embodied in a manner similar to that illustrated in FIG. 13. However, protection circuitry 1204 and 1206 are not limited to being embodied according to FIG. 13.

Protection circuitry 1300 includes a current source 1302, a P-channel FET 1304, a first resistor 1306, a second resistor 1308, and a diode 1310. Current source 1302 is electrically coupled to a gate (G) of P-channel FET 1304, and first resistor 1306 is electrically coupled between the gate of P-channel FET 1304 and the source of FET 510. Diode 1310 is electrically coupled between the gate and the source of FET 510, such that a cathode (K) of diode 1310 is electrically coupled to the gate of FET 510, and an anode (A) of diode 1310 is electrically coupled to the source of FET 510. A source (S) of P-channel FET 1304 is electrically coupled to the gate of FET 510, and second resistor 1308 is electrically coupled between a drain (D) of P-channel FET 1304 and the source of FET 510. Current source 1302, P-channel FET 1304, first resistor 1306, and second resistor 1308 collectively prevent voltage gate-to-source voltage $V_{gs}$ magnitude of FET 510 from exceeding a voltage $V_{max}$, where $V_{max}$ is defined as $V_{max} = (I_{1302}*R_{1306} + V_{th\_1})$, where $I_{1302}$ is magnitude of current from current source 1302, $R_{1306}$ is resistance of first resistor 1306, $V_{th\_1}$ is gate-to-source threshold voltage of P-channel FET 1304. Diode 1310 conducts current in the event that a reverse polarity voltage is applied between the gate of FET 510 and the source of FET 510, thereby clamping magnitude of the reverse polarity voltage to a forward conduction voltage of diode 1310, such as to approximately 0.6 volts to 0.7 volts.

Figure 14:
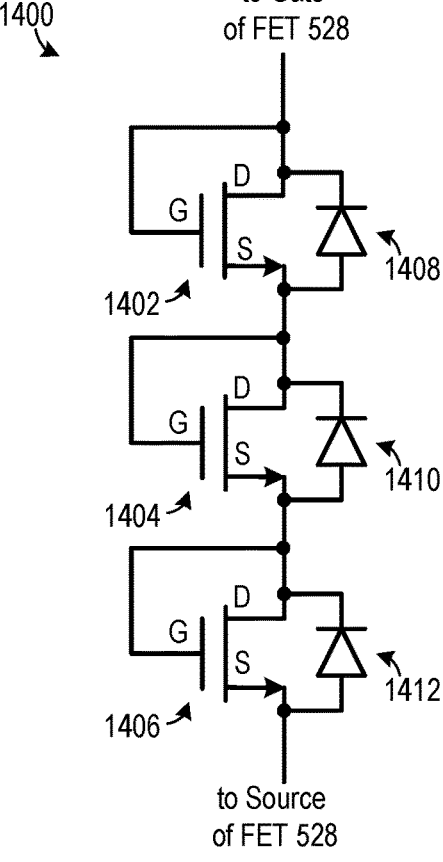
FIG. 14 is a schematic diagram of another embodiment of protection circuitry of the FIG. 12 electrical circuit.

FIG. 14 is a schematic diagram of a protection circuit 1400, which is one possible embodiment of protection circuitry 1208 of FIG. 12. However, protection circuitry 1208 is not limited to being embodied according to FIG. 14. Protection circuitry 1400 includes a first N-channel FET 1402, a second N-channel FET 1404, and a third N-channel FET 1406 electrically coupled in series between the gate of FET 528 and the source of FET 528. In particular, each of a gate (G) and drain (D) of first N-channel FET 1402 is electrically coupled to the gate of FET 528, and a source (S) of first N-channel FET 1402 is electrically coupled to each of a drain (D) and a gate (G) of second N-channel FET 1404. A source (s) of second N-channel FET 1404 is electrically coupled to each of a drain (D) and a gate (G) of third N-channel FET 1406, and a source (S) of third N-channel FET 1406 is electrically coupled to the source of FET 528. First N-channel FET 1402, a second N-channel FET 1404, and a third N-channel FET 1406 collectively limit gate-to-source $V_{gs}$ of FET 528 to the sum of respective threshold voltages of each of the three N-channel FETs, e.g., to approximately 1.8 volts. Additionally, respective body diodes 1408, 1410, and 1412 of N-channel FETs 1402, 1404, and 1406, in conjunction with resistor 534 (FIG. 5), clamp magnitude of any reverse polarity voltage applied between the gate of FET 528 and the source of FET 528, such as to a magnitude of approximately three body diode forward conduction voltages.

Figure 15:
FIG. 15 is a schematic diagram of an embodiment of the FIG. 5 electrical circuit where a load is embodied by a camera.

FIG. 15 is a schematic diagram of an electrical circuit 1500, which is an embodiment of electrical circuit 500 (FIG. 5) where load 508 is embodied by a camera 1508. In some embodiments, camera 1508 is a camera of an automobile. It is understood, though, that load 508 (FIG. 5) is not limited to being a camera, and load 508 could be essentially any type of electrical load. For example, in some embodiments, load 508 includes an inductor of a switching power converter or a capacitor of a switched capacitor converter. Furthermore, load 508 need not be a discrete element but could instead be a circuit, a system, etc. Load 508 also need not be referenced to ground.

Applicant has conducted simulations which show that particular embodiments of the new transistor assemblies with gate current shunting capability may achieve significantly higher performance than transistor assemblies without gate current shunting capability. For example, FIG. 16 includes five graphs 1602, 1604, 1606, 1608, and 1610 illustrating one example of operation of electrical circuit 100 (FIG. 1), which does not have gate current shunting capability. Each of graphs 1602, 1604, 1606, 1608, and 1610 share a common horizontal axis representing time, where a time of zero corresponds to electrical circuit 100 beginning to start up. Graph 1602 illustrates simulated voltage $V_h$ of first power supply 104 versus time, graph 1604 represents simulated voltage $V_{gs}$ of FET 110 versus time, graph 1606 represents simulated input current $I_{in}$ (see FIG. 1) versus time, graph 1608 represents simulated channel current $I_{ch}$ of FET 120 versus time, and graph 1610 represents simulated substrate current $I_{sub}$ of FET 120 (see FIG. 4) versus time. Each of the simulations of FIG. 16 assumes that voltage $V_h$ of first power supply 104 has a slope of $1.6 \times 10^7$ microvolt per microsecond during start-up of electrical circuit 100. As evident from the graphs of FIG. 16, channel current and substrate current have large peak magnitudes, i.e., around 36 amperes and 3 amperes respectively, during operation of transistor assembly 102 in the pre-power state. Such large peak current magnitudes are undesirable and may cause improper operation of electrical circuit 100, damage one or more elements of electrical circuit 100 as well as circuitry connected to electrical circuit 100, and/or present a safety concern.

Figure 16:
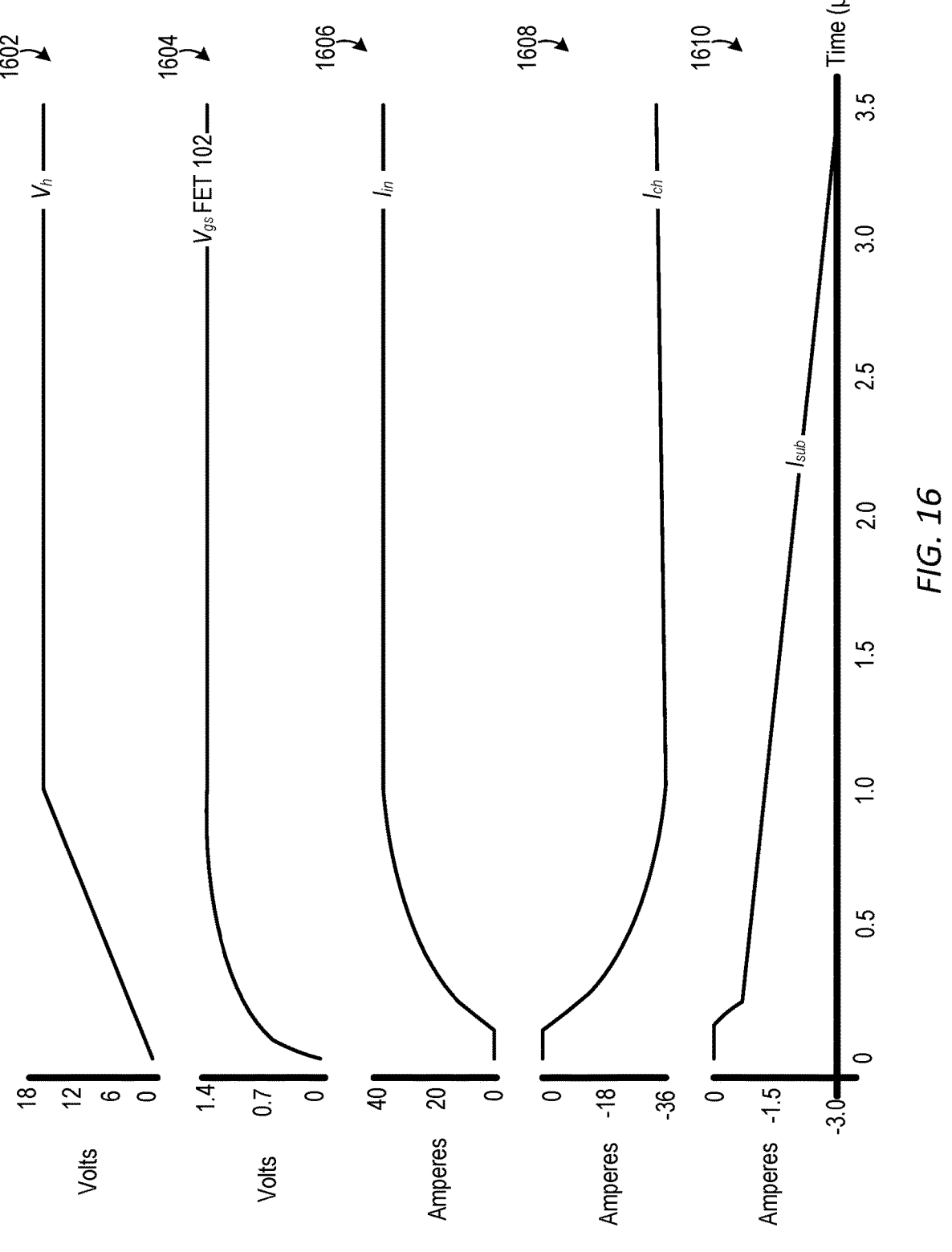
FIG. 16 includes five graphs illustrating one example of operation the FIG. 1 electrical circuit.
Figure 17:
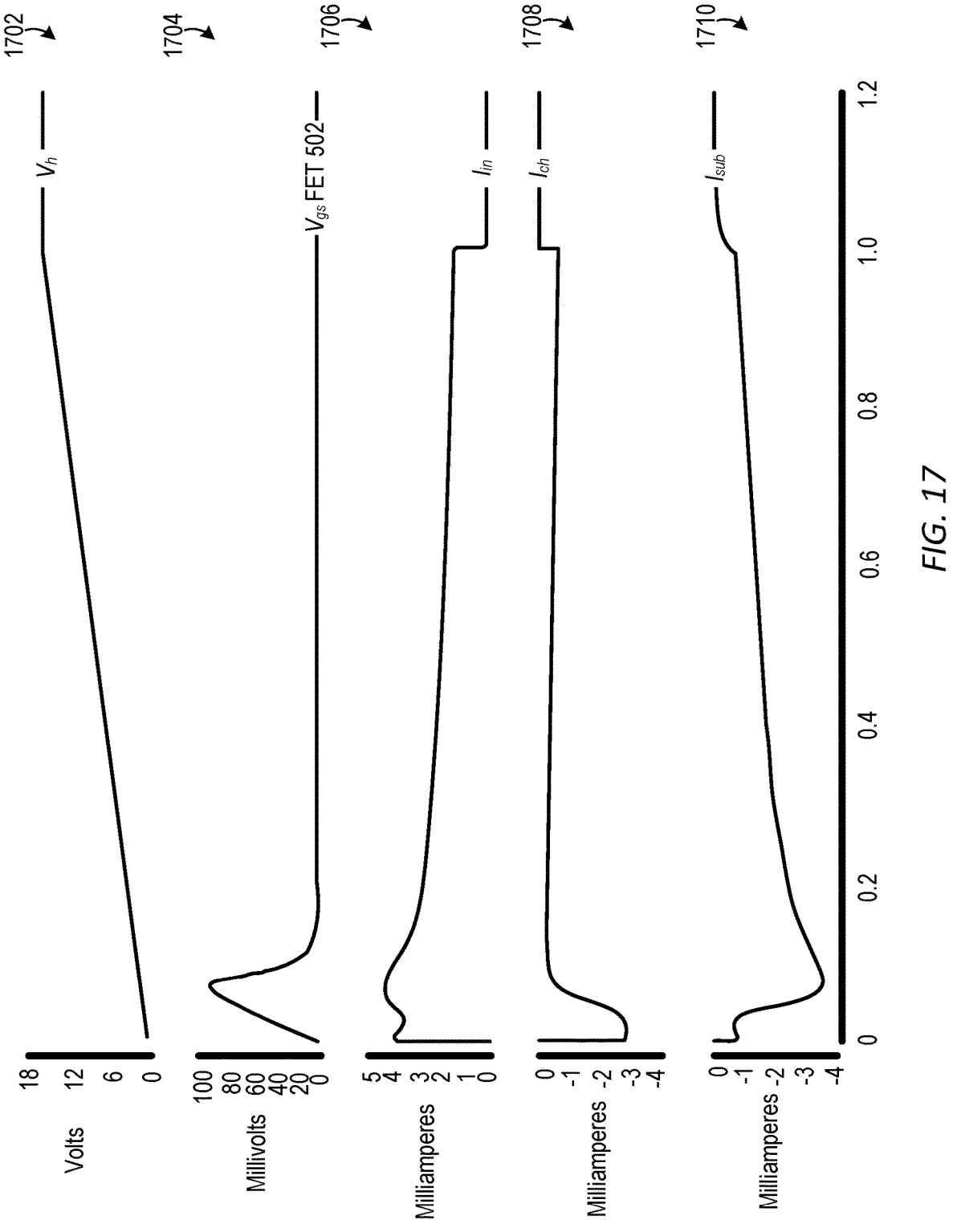
FIG. 17 includes five graphs illustrating one example of operation of an embodiment of the FIG. 5 electrical circuit.

FIG. 17 includes five graphs 1702, 1704, 1706, 1708, and 1710 illustrating one example of operation of an embodiment of electrical circuit 500 (FIG. 5), which has gate current shunting capability. Each of graphs 1702, 1704, 1706, 1708, and 1710 share a common horizontal axis representing time, where a time of zero corresponds to electrical circuit 500 beginning to start up. Graph 1702 illustrates simulated voltage $V_h$ of first power supply 504 versus time, graph 1704 represents simulated voltage $V_{gs}$ of FET 510 versus time, graph 1706 represents simulated input current $I_{inch}$ (see FIG. 5) versus time, graph 1708 represents simulated channel current $I_{ch}$ of FET 520 versus time, and graph 1710 represents simulated substrate current $I_{sub}$ of FET 520 versus time. Each of the simulations of FIG. 17 assumes that voltage $V_h$ of first power supply 504 has a slope of $1.6 \times 10^7$ microvolt per microsecond during start-up of electrical circuit 500. Peak channel and substrate currents of the FIG. 17 simulation are only around 3 milliamperes and 4 milliamperes respectively, which are dramatically lower than analogous values of the FIG. 16 simulation. As such, the simulations of FIGS. 16 and 17 show that the new transistor assemblies with gate current shunting capability are capable of achieving significantly lower peak current magnitudes during a pre-power state than transistor assemblies without gate current shunting capability.

Combinations of Features

Features described above may be combined in various ways without departing from the scope hereof. The following examples illustrate some possible combinations.

(A1) A transistor assembly with gate current shunting capability includes (1) a first field effect transistor (FET) including a first gate, a first drain, and a first source, the first FET being an N-channel FET, and the first drain being electrically coupled to a first power supply, (2) a first pull-up current source electrically coupled to the first gate, (3) a first pull-down current source electrically coupled to first gate, (4) a first switching device electrically coupled in series with the first pull-down current source, the first switching device being configured to be controlled by a first control signal, (5) a control circuit at least partially powered by a second power supply and configured to generate the first control signal to control an operating state of the first FET, and (6) a capacitor and a second FET collectively configured to shunt current away from the first gate during a pre-power operating state of the transistor assembly, the pre-power operating state of the transistor assembly being characterized at least partially by (a) the first power supply being active and (b) the second power supply being inactive.

(A2) In the transistor assembly denoted as (A1), the capacitor may be electrically coupled to a gate of the second FET.

(A3) In either one of the transistor assemblies denoted as (A1) or (A2), (1) the second FET may be an N-channel FET including a second gate, a second drain, and a second source, (2) the second drain may be electrically coupled to the first gate, and (3) the capacitor may be electrically coupled between the first power supply and the second gate.

(A4) In the transistor assembly denoted as (A3), the second source may be electrically coupled to the first source.

(A5) In the transistor assembly denoted as (A3), the second source may be electrically coupled to a reference node.

(A6) Any one of the transistor assemblies denoted as (A3) through (A5) may further include a second switching device configured to discharge a gate-to-source capacitance of the second FET in response to a second control signal generated by the control circuit.

(A7) In the transistor assembly denoted as (A6), the control circuit may be further configured to assert the second control signal when the second power supply is active, and thereby cause the second switching device to operate in its on-state.

(A8) Either one of the transistor assemblies denoted as (A6) or (A7) may further include a resistor, and the second switching device and the resistor may be electrically coupled in series between the second gate and a reference node.

(A9) Either one of the transistor assemblies denoted as (A1) or (A2) may further include a second switching device configured to discharge a gate-to-source capacitance of the second FET in response to a second control signal generated by the control circuit.

(A10) In the transistor assembly denoted as (A9), the control circuit may be further configured to assert the second control signal and thereby cause the second switching device to operate in its on-state when the second power supply is active.

(B1) A method for shunting current away from a gate of a first N-channel field effect transistor (FET) including a drain electrically coupled to a first power supply, the method including (1) charging a gate-to-source capacitance of a second N-channel FET via a capacitor electrically coupled to a gate of the second N-channel FET, and (2) shunting current away from the gate of the first N-channel FET via the second N-channel FET, a drain of the second N-channel FET being electrically coupled to the gate of the first N-channel FET.

(B2) In the method denoted as (B1), shunting current away from the gate of the first N-channel FET via the second N-channel FET may include shunting current around a gate-to-source capacitance of the first N-channel FET.

(B3) In the method denoted as (B1), shunting current away from the gate of the first N-channel FET via the second N-channel FET may include shunting current from the gate of the first N-channel FET to a reference node.

(B4) Any one of the methods denoted as (B1) through (B3) may further include discharging the gate-to-source capacitance of the second N-channel FET once a second power supply becomes active.

(B5) In the method denoted as (B4), the second power supply may be configured to power a control circuit that is configured to control an operating state of the first N-channel FET.

(C1) An electrical circuit configured to be electrically coupled to a load includes a first power supply, a second power supply, and a transistor assembly. The transistor assembly includes (1) a first field effect transistor (FET) and a second FET, the first FET and the second FET being configured to be electrically coupled in series between the first power supply and the load, each of the first FET and the second FET being a respective N-channel FET, (2) a control circuit at least partially powered by the second power supply, the control circuit being configured to control a respective operating state of each of the first FET and the second FET, and (3) a capacitor and a third FET collectively configured to shunt current away from a gate of the first FET during a pre-power operating state of the transistor assembly characterized at least partially by (a) the first power supply being active and (b) the second power supply being inactive.

(C2) In the electrical circuit denoted as (C1), the load may include a camera.

(C3) In either one of the electrical circuits denoted as (C1) or (C2), (1) the third FET may include a gate and a drain, (2) the capacitor may be electrically coupled between the first power supply and the gate of the third FET, and (3) the drain of the third FET may be electrically coupled to the gate of the first FET.

(C4) In the electrical circuits denoted as (C3), a source of the third FET may be electrically coupled to one of (a) a source of the first FET and (b) a reference node.

(C5) Either one of the electrical circuits denoted as (C3) and (C4) may further include a switching device configured to discharge a gate-to-source capacitance of the third FET in response to a signal asserted after the second power supply is active.

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which as a matter of language, might be said to fall therebetween.

What is claimed is:

1. A transistor assembly with gate current shunting capability, comprising:
   a first field effect transistor (FET) including a first gate, a first drain, and a first source, the first FET being an N-channel FET, and the first drain being electrically coupled to a first power supply;
   a first pull-up current source electrically coupled to the first gate;
   a first pull-down current source electrically coupled to the first gate;
   a first switching device electrically coupled in series with the first pull-down current source, the first switching device being configured to be controlled by a first control signal;
   a control circuit at least partially powered by a second power supply and configured to generate the first control signal to control an operating state of the first FET; and
   a capacitor and a second FET collectively configured to shunt current away from the first gate during a pre-power operating state of the transistor assembly, the pre-power operating state of the transistor assembly being characterized at least partially by (a) the first power supply being active and (b) the second power supply being inactive.

2. The transistor assembly of claim 1, wherein the capacitor is electrically coupled to a gate of the second FET.

3. The transistor assembly of claim 1, wherein:
   the second FET is an N-channel FET including a second gate, a second drain, and a second source;
   the second drain is electrically coupled to the first gate; and
   the capacitor is electrically coupled between the first power supply and the second gate.

4. The transistor assembly of claim 3, wherein the second source is electrically coupled to the first source.

5. The transistor assembly of claim 3, wherein the second source is electrically coupled to a reference node.

6. The transistor assembly of claim 3, further comprising a second switching device configured to discharge a gate-to-source capacitance of the second FET in response to a second control signal generated by the control circuit.

7. The transistor assembly of claim 6, wherein the control circuit is further configured to assert the second control signal when the second power supply is active, and thereby cause the second switching device to operate in its on-state.

8. The transistor assembly of claim 6, further comprising a resistor, the second switching device and the resistor being electrically coupled in series between the second gate and a reference node.

9. The transistor assembly of claim 1, further comprising a second switching device configured to discharge a gate-to-source capacitance of the second FET in response to a second control signal generated by the control circuit.

10. The transistor assembly of claim 9, wherein the control circuit is further configured to assert the second control signal and thereby cause the second switching device to operate in its on-state when the second power supply is active.

11. A method for shunting current away from a gate of a first N-channel field effect transistor (FET) including a drain electrically coupled to a first power supply, the method comprising:

charging a gate-to-source capacitance of a second N-channel FET via a capacitor electrically coupled to a gate of the second N-channel FET;

shunting current away from the gate of the first N-channel FET via the second N-channel FET, a drain of the second N-channel FET being electrically coupled to the gate of the first N-channel FET; and discharging the gate-to-source capacitance of the second N-channel FET in response to a second power supply becoming active.

12. The method of claim 11, wherein shunting current away from the gate of the first N-channel FET via the second N-channel FET comprises shunting current around a gate-to-source capacitance of the first N-channel FET.

13. The method of claim 11, wherein shunting current away from the gate of the first N-channel FET via the second N-channel FET comprises shunting current from the gate of the first N-channel FET to a reference node.

14. The method of claim 11, wherein the second power supply is configured to power a control circuit that is configured to control an operating state of the first N-channel FET.

15. An electrical circuit configured to be electrically coupled to a load, comprising:

a first power supply;

a second power supply; and a transistor assembly, including:

a first field effect transistor (FET) and a second FET, the first FET and the second FET being configured to be electrically coupled in series between the first power supply and the load, each of the first FET and the second FET being a respective N-channel FET, a control circuit at least partially powered by the second power supply, the control circuit being configured to control a respective operating state of each of the first FET and the second FET, and a capacitor and a third FET collectively configured to shunt current away from a gate of the first FET during a pre-power operating state of the transistor assembly characterized at least partially by (a) the first power supply being active and (b) the second power supply being inactive.

16. The electrical circuit of claim 15, wherein the load comprises a camera.

17. The electrical circuit of claim 15, wherein:

the third FET comprises a gate and a drain;

the capacitor is electrically coupled between the first power supply and the gate of the third FET; and the drain of the third FET is electrically coupled to the gate of the first FET.

18. The electrical circuit of claim 17, wherein a source of the third FET is electrically coupled to one of (a) a source of the first FET and (b) a reference node.

19. The electrical circuit of claim 17, further comprising a switching device configured to discharge a gate-to-source capacitance of the third FET in response to a signal asserted after the second power supply is active.

20. The electrical circuit of claim 16, wherein the camera is a camera of an automobile.

* * * * *